United States Patent
Lai et al.

(10) Patent No.: US 10,515,810 B2
(45) Date of Patent: Dec. 24, 2019

(54) SELF-ALIGNED DI-SILICON SILICIDE BIT LINE AND SOURCE LINE LANDING PADS IN 3D VERTICAL CHANNEL MEMORY

(71) Applicant: MACRONIX INTERNATIONAL CO., LTD., Hsinchu (TW)

(72) Inventors: Erh-Kun Lai, Tarrytown, NY (US); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/949,346

(22) Filed: Apr. 10, 2018

(65) Prior Publication Data
US 2019/0311907 A1    Oct. 10, 2019

(51) Int. Cl.
H01L 21/285    (2006.01)
H01L 29/45     (2006.01)
H01L 23/528    (2006.01)
H01L 27/11582  (2017.01)

(52) U.S. Cl.
CPC ...... *H01L 21/28518* (2013.01); *H01L 23/528* (2013.01); *H01L 27/11582* (2013.01); *H01L 29/456* (2013.01)

(58) Field of Classification Search
CPC ............. H01L 21/28518; H01L 23/528; H01L 27/11582
See application file for complete search history.

(56) References Cited

U.S. PATENT DOCUMENTS

| 5,624,869 A * | 4/1997 | Agnello ............ H01L 21/28518 257/E21.165 |
| 7,679,133 B2 | 3/2010 | Son et al. |
| 8,236,650 B2 | 8/2012 | Son et al. |
| 8,492,828 B2 | 7/2013 | Son et al. |
| 8,884,357 B2 | 11/2014 | Wang et al. |
| 9,147,468 B1 | 9/2015 | Lue |
| 9,165,786 B1 | 10/2015 | Purayath et al. |
| 9,520,406 B2 | 12/2016 | Makala et al. |

(Continued)

OTHER PUBLICATIONS

Ishiduki et al., "Optimal device structure for pipe-shaped BiCS flash memory for ultra high density storage device with excellent performance and reliability," In Electron Devices Meeting (IEDM), 2009 IEEE International, 4 pages, IEEE, 2009.

(Continued)

*Primary Examiner* — Errol V Fernandes
(74) *Attorney, Agent, or Firm* — Haynes Beffel & Wolfeld LLP

(57) ABSTRACT

A method for manufacturing a memory device comprises forming an initial silicide layer, including depositing and annealing a precursor metal over a layer of silicon material on a top surface of a stack of conductive strips in amounts effective to result in a majority of the initial silicide layer being a mono-silicon silicide of the precursor metal. The method comprises depositing and annealing additional silicon material over the initial silicide layer in amounts effective to result in formation of di-silicon silicide of the precursor metal to form a landing pad on the top surface of the stack of conductive strips, the formation of the di-silicon silicide of the precursor metal consuming mono-silicon silicide of the initial silicide layer so a majority of a silicide of the landing pad is di-silicon silicide.

17 Claims, 9 Drawing Sheets

(56) References Cited

U.S. PATENT DOCUMENTS

| | | |
|---|---|---|
| 9,520,501 B2 | 12/2016 | Koldiaev et al. |
| 9,524,980 B2 | 12/2016 | Lue |
| 9,698,153 B2 | 7/2017 | Liu et al. |
| 2003/0003641 A1* | 1/2003 | Cho .................. H01L 28/75 438/200 |
| 2010/0258855 A1 | 10/2010 | Yilmaz et al. |
| 2016/0260733 A1* | 9/2016 | Lue .................. H01L 27/11582 |

OTHER PUBLICATIONS

Jung et al., "Three Dimensionally Stacked NAND Flash Memory Technology Using Stacking Single Crystal Si Layers on ILD and Tanos Structure for Beyond 30nm Node," IEEE International Electron Devices Meeting, Dec. 11-13, 2006.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, Jun. 16-18, 2009, 2 pages.

Lai et al., "A Multi-Layer Stackable Thin-Film Transistor (TFT) NAND-Type Flash Memory," IEEE International Electron Devices Meeting, Dec. 11-13, 2006.

\* cited by examiner

SELF-ALIGNED DI-SILICON SILICIDE BIT LINE AND SOURCE LINE LANDING PADS IN 3D VERTICAL CHANNEL MEMORY

BACKGROUND

Field

The present technology relates to high density memory devices, and particularly to memory devices in which memory cells have vertical channel structures.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, vertical NAND cells are applied in a charge trapping memory technology. In such technology, a landing pad connects a bit line to a top region of a vertical channel film. However, the landing pad may be too thin to land on the top region of the vertical channel film during a process to form the landing pad. Extra lithography and etch steps are needed to form a thicker landing pad that can more reliably land on the top region of the vertical channel film.

In addition, during a process to form the thicker landing pad, a vertical channel film may be consumed away at its top due to limited silicon resource from the vertical channel film. Such a process may cause the landing pad to be discontinuous with the vertical channel film, or a current path through the landing pad and the vertical channel film to have a high resistance not suitable for bit line connection to a vertical channel film.

It is desirable to provide a landing pad for bit line connection to a vertical channel film with increased thickness and reduced resistance for 3D NAND flash memories having vertical channel structures.

SUMMARY

The present technology provides a landing pad for bit line connection to a vertical channel film with increased thickness and reduced resistance for 3D NAND flash memories having vertical channel structures, and a method for manufacturing the same.

A method for manufacturing a memory device comprises forming an initial silicide layer, including depositing and annealing a precursor metal over a layer of silicon material on a top surface of a stack of conductive strips in amounts effective to result in a majority of the initial silicide layer being a mono-silicon silicide of the precursor metal. The method comprises depositing and annealing additional silicon material over the initial silicide layer in amounts effective to result in formation of di-silicon silicide of the precursor metal to form a landing pad on the top surface of the stack of conductive strips, the formation of the di-silicon silicide of the precursor metal consuming mono-silicon silicide of the initial silicide layer so a majority of a silicide of the landing pad is di-silicon silicide. As used herein, a majority of a silicide means more than 50% of the silicide.

Forming the initial silicide layer includes annealing at a first temperature range, and the annealing of the additional silicon material is performed at a second temperature range higher than the first temperature range.

The method comprises forming the layer of silicon material on the top surface of the stack of conductive strips and sidewalls of the conductive strips in the stack of conductive strips, the conductive strips in the stack including word lines coupled to memory cells on the sidewalls of the conductive strips in the stack, the layer of silicon material including a vertical thin channel film in the memory cells on the sidewalls of the conductive strips in the stack, wherein the di-silicon silicide of the precursor metal of the landing pad is electrically continuous with and physically in contact with the vertical thin channel film on the sidewalls of the conductive strips in the stack.

The layer of silicon material can be formed by depositing a first layer of silicon material conformally to a memory layer on the top surface of the stack of conductive strips and sidewalls of the conductive strips in the stack, and depositing a second layer of silicon material non-conformally over the first layer of silicon material.

Remnants of the precursor metal is removed, after forming the initial silicide layer. Remnants of the additional silicon material is removed, after the formation of the di-silicon silicide of the precursor metal.

The method comprises forming a bit line over the landing pad, the bit line contacting the di-silicon silicide of the precursor metal of the landing pad. The memory device can comprise a second landing pad disposed on a top surface of a second stack of conductive strips adjacent the first-mentioned stack of conductive strips, a majority of a silicide of the second landing pad being di-silicon silicide. The method comprises forming a source line over the second landing pad, the source line contacting the di-silicon silicide of the precursor metal of the second landing pad.

In one embodiment, the precursor metal includes Cobalt (Co). In an alternative embodiment, the precursor metal includes Nickel (Ni).

A memory device including a plurality of memory cells in accordance with the present technology is provided. The memory device comprises a stack of conductive strips having sidewalls, data storage structures on the sidewalls of the conductive strips in the stack, and a vertical thin channel film disposed vertically in contact with the data storage structures on the sidewalls of the conductive strips in the stack. The memory cells in the plurality of memory cells have channels in the vertical thin channel film and gates in the conductive strips in the stack.

A landing pad including silicide is disposed on a top surface of the stack of conductive strips, the silicide consisting essentially of di-silicon silicide. As used herein, a silicide consisting essentially of di-silicon silicide means more than 50% of the silicide is di-silicon silicide.

The landing pad is electrically continuous with and physically in contact with the vertical thin channel film on the sidewalls of the conductive strips in the stack.

A bit line can be arranged over the landing pad, the bit line contacting the di-silicon silicide of the landing pad. A second landing pad can be disposed on a top surface of a second stack of conductive strips adjacent the first-mentioned stack of conductive strips, the second landing pad including the silicide consisting essentially of di-silicon silicide. A source line can be arranged over the second landing pad, the source line contacting the di-silicon silicide of the second landing pad.

In one embodiment, the di-silicon silicide of the landing pad includes $CoSi_2$. In an alternative embodiment, the di-silicon silicide of the landing pad includes $NiSi_2$.

Other aspects and advantages of the present technology can be seen on review of the drawings, the detailed description and the claims, which follow.

BRIEF DESCRIPTION OF THE DRAWINGS

FIG. 3 illustrates a stage of the process flow after forming an insulating layer and a plurality of layers of a conductive material on the insulating layer.

FIG. 4 illustrates a stage of the process flow after etching the plurality of layers to define a plurality of stacks of conductive strips.

FIG. 5 illustrates a stage of the process flow after forming a memory layer over top surfaces of the stacks and sidewalls of the conductive strips in the stacks, and a layer of silicon material on the memory layer.

FIG. 6 illustrates a stage in the process flow after filling between stacks on the inside surfaces of the layer of silicon material with an insulating material.

FIG. 7 illustrates a stage in the process flow after forming an initial silicide layer over a layer of silicon material on a top surface of a stack of conductive strips.

FIG. 8 illustrates a stage in the process flow after depositing additional silicon material over the initial silicide layer.

FIG. 9 illustrates a stage in the process flow after annealing the additional silicon material.

DETAILED DESCRIPTION

Figure 1:
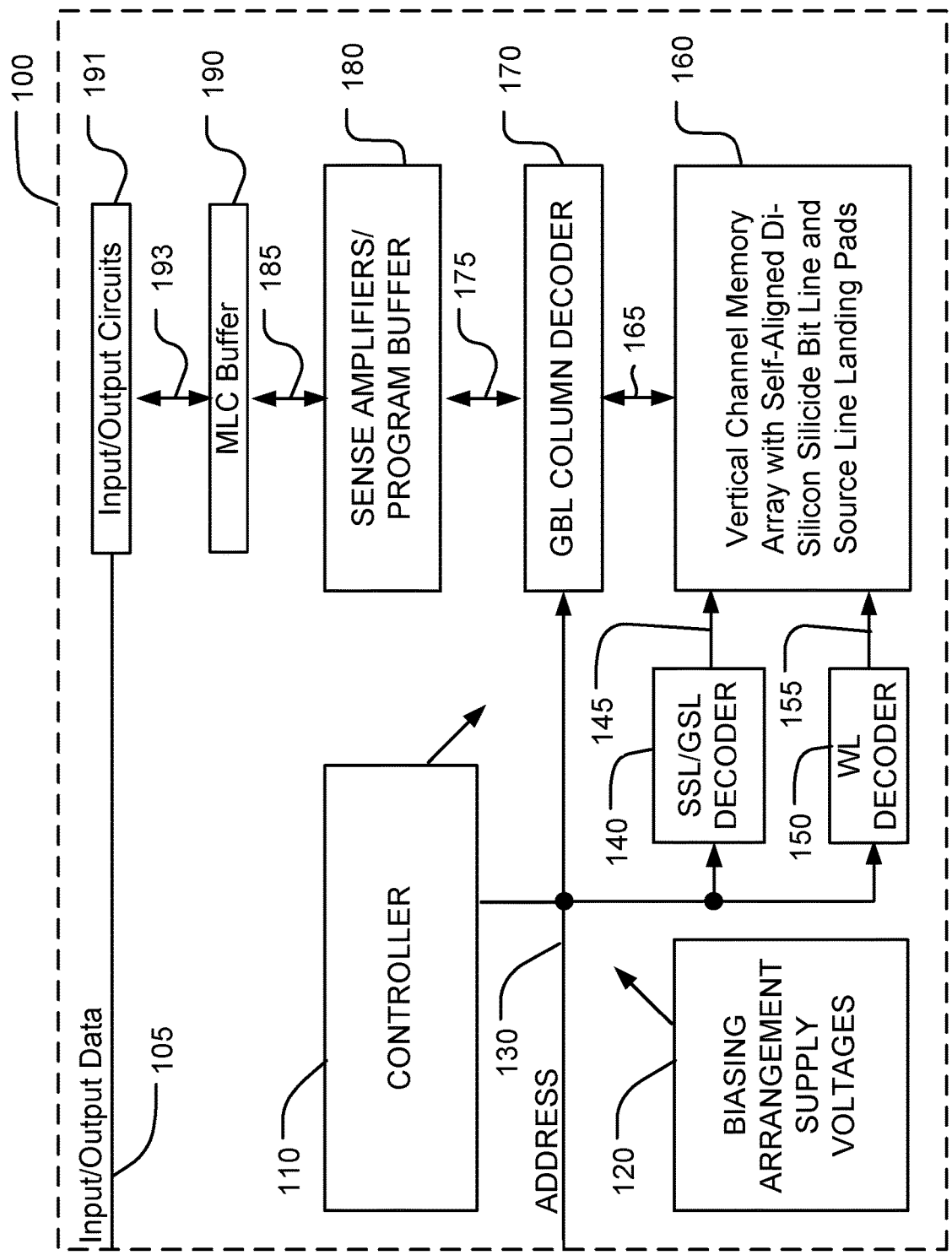
FIG. 1 is a simplified chip block diagram of an integrated circuit including a 3D, vertical thin-channel film memory array.

A detailed description of embodiments of the present technology is provided with reference to the Figures. The following description will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. A detailed description of embodiments of the present technology is provided with reference to the Figures. Like elements in various figures are commonly referred to with like reference numerals.

FIG. 1 is a simplified chip block diagram of an integrated circuit 100 including a 3D, vertical thin-channel film memory array (e.g. 160), including a plurality of memory cells.

The memory array 160 comprises a stack of conductive strips having sidewalls, data storage structures on the sidewalls of the conductive strips in the stack, and a vertical thin channel film disposed vertically in contact with the data storage structures on the sidewalls of the conductive strips in the stack. The memory cells in the plurality of memory cells have channels in the vertical thin channel film and gates in the conductive strips in the stack.

The memory array 160 comprises a landing pad including silicide disposed on a top surface of the stack of conductive strips, where the silicide consists essentially of di-silicon silicide. The landing pad is electrically continuous with and physically in contact with the vertical thin channel film on the sidewalls of the conductive strips in the stack.

A bit line can be arranged over the landing pad, the bit line contacting the di-silicon silicide of the landing pad. The memory array 160 can comprise a second landing pad disposed on a top surface of a second stack of conductive strips adjacent the first-mentioned stack of conductive strips, the second landing pad including the silicide consisting essentially of di-silicon silicide. A source line can be arranged over the second landing pad, the source line contacting the di-silicon silicide of the second landing pad.

In one embodiment, the di-silicon silicide of the landing pad includes $CoSi_2$. In an alternative embodiment, the di-silicon silicide of the landing pad includes $NiSi_2$.

An SSL/GSL decoder 140 is coupled to a plurality of SSL/GSL lines 145, arranged in the memory array 160. A word line decoder 150 is coupled to a plurality of word lines 155. A global bit line column decoder 170 is coupled to a plurality of global bit lines 165 arranged along columns in the memory array 160 for reading data from and writing data to the memory array 160. Addresses are supplied on bus 130 from control logic 110 to decoder 170, decoder 140 and decoder 150. Sense amplifier and program buffer circuits 180 are coupled to the column decoder 170, in this example via first data lines 175. The program buffer in circuits 180 can store program codes for multiple-level programming, or values that are a function of the program codes, to indicate program or inhibit states for selected bit lines. The column decoder 170 can include circuits for selectively applying program and inhibit voltages to bit lines in the memory in response to the data values in the program buffer.

Sensed data from the sense amplifier/program buffer circuits are supplied via second data lines 185 to multi-level data buffer 190, which is in turn coupled to input/output circuits 191 via a data path 193. Also, input data is applied in this example to the multi-level data buffer 190 for use in support of multiple-level program operations for each of the independent sides of the independent double gate cells in the array.

Input/output circuits 191 drive the data to destinations external to the integrated circuit 100. Input/output data and control signals are moved via data bus 105 between the input/output circuits 191, the control logic 110 and input/output ports on the integrated circuit 100 or other data sources internal or external to the integrated circuit 100, such as a general purpose processor or special purpose application circuitry, or a combination of modules providing system-on-a-chip functionality supported by the memory array 160.

In the example shown in FIG. 1, control logic 110, using a bias arrangement state machine, controls the application of supply voltages generated or provided through the voltage supply or supplies in block 120, such as read, erase, verify and program bias voltages. The control logic 110 is coupled to the multi-level data buffer 190 and the memory array 160. The control logic 110 includes logic to control multiple-level program operations.

The control logic 110 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 160 can comprise charge trapping memory cells configured to store multiple bits per cell, by the establishment of multiple program levels that correspond to amounts of charge stored, which in turn establish memory cell threshold voltages $V_T$. Single-bit-per-cell embodiments can include the structures described herein.

Figure 2:
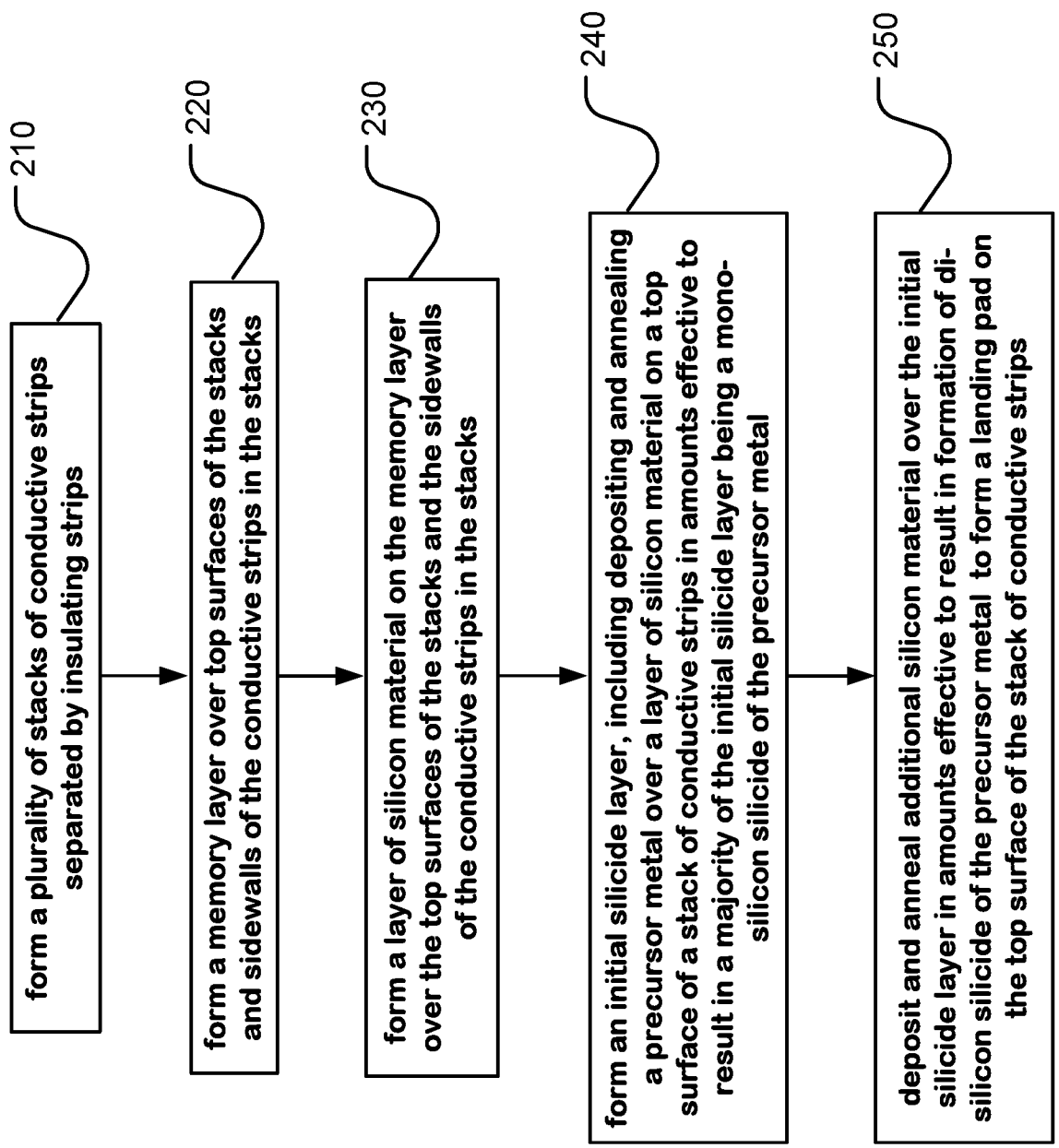
FIG. 2 is a flow chart illustrating a method for manufacturing an integrated circuit memory device including a landing pad disposed on a top surface of a stack of conductive strips, the landing pad having a silicide consisting essentially of di-silicon silicide.

FIG. 2 is a flow chart illustrating a method for manufacturing an integrated circuit memory device including a landing pad disposed on a top surface of a stack of conductive strips, the landing pad having a silicide consisting essentially of di-silicon silicide.

At Step 210, the method includes forming a plurality of stacks of conductive strips separated by insulating strips. The method can include forming a plurality of layers of a conductive material (e.g. 310, 320, 330, 340, 350, FIG. 3), suitable to act as ground select lines, word lines and string select lines, separated by insulating material, and etching the plurality of layers to define a plurality of stacks of conductive strips (e.g. 410, 430, 450, FIG. 4). The stacks can include at least a bottom plane of conductive strips acting as ground select lines (GSLs), a plurality of intermediate planes of conductive strips acting as word lines (WLs), and a top plane of conductive strips acting as string select lines (SSLs).

At Step 220, the method includes forming a memory layer (e.g. 510, FIG. 5) over top surfaces of the stacks and sidewalls of the conductive strips in the stacks, and over the bottom of the trenches between the stacks. The memory layer can comprise a multilayer data storage structure as discussed with reference to FIG. 5. The memory layer contacts side surfaces of conductive strips in the plurality of conductive strips.

At Step 230, the method includes forming a layer of silicon material (e.g. 520, FIG. 5) on the memory layer over the top surfaces of the stacks and the sidewalls of the conductive strips in the stacks, and over the bottom of the trenches between the stacks. The conductive strips in the stacks can include word lines coupled to memory cells on the sidewalls of the conductive strips in the stacks. The layer of silicon material can include vertical thin channel films in the memory cells on the sidewalls of the conductive strips in the stacks. The layer of silicon material can be formed in two sub-steps as further described in reference to FIG. 5.

At Step 240, the method includes forming an initial silicide layer, including depositing and annealing a precursor metal (Cobalt) over a layer of silicon material on a top surface of a stack of conductive strips in amounts effective to result in a majority of the initial silicide layer being a mono-silicon silicide of the precursor metal.

At Step 250, the method includes depositing and annealing additional silicon material over the initial silicide layer in amounts effective to result in formation of di-silicon silicide of the precursor metal (e.g. CoSi2) to form a landing pad on the top surface of the stack of conductive strips, where the formation of the di-silicon silicide of the precursor metal can consume mono-silicon silicide of the initial silicide layer so a majority of a silicide of the landing pad is di-silicon silicide. The di-silicon silicide of the precursor metal of the landing pad is electrically continuous with and physically in contact with the vertical thin channel film on the sidewalls of the conductive strips in the stack.

Forming the initial silicide layer can include annealing at a first temperature range (e.g. 400° C. to 600° C.), and the annealing of the additional silicon material can be performed at a second temperature range (e.g. 600° C. to 800° C.) higher than the first temperature range.

The method can include forming a bit line over the landing pad, the bit line contacting the di-silicon silicide of the precursor metal of the landing pad. The memory device can comprise a second landing pad disposed on a top surface of a second stack of conductive strips adjacent the first-mentioned stack of conductive strips, a majority of a silicide of the second landing pad being di-silicon silicide. The method can include forming a source line over the second landing pad, the source line contacting the di-silicon silicide of the precursor metal of the second landing pad.

In one embodiment, the precursor metal can include Cobalt (Co), the layer of silicon material and the additional silicon material can include polycrystalline silicon, the initial silicide layer can include CoSi, and the di-silicon silicide of the precursor metal can include $CoSi_2$. 1 nm of Co can result in 2.02 nm of CoSi, while 1 nm of Co can result in 3.52 nm of $CoSi_2$. Consequently the di-silicon silicide of the precursor metal including $CoSi_2$ can produce a thicker di-silicon silicide $CoSi_2$ than a mono-silicon silicide CoSi, increasing a process window for forming a landing pad. $CoSi_2$ has a thin film resistivity of 14-20μΩcm, which is lower than a thin film resistivity of N+ polysilicon as used in a conventional method for forming a landing pad.

In an alternative embodiment, the precursor metal can include Nickel (Ni), the layer of silicon material and the additional silicon material can include polycrystalline silicon, the initial silicide layer can include NiSi, and the di-silicon silicide of the precursor metal can include $NiSi_2$. 1 nm of Ni can result in 2.34 nm of NiSi, while 1 nm of Ni can result in 3.63 nm of $NiSi_2$. Consequently the di-silicon silicide of the precursor metal including $NiSi_2$ can produce a thicker di-silicon silicide $NiSi_2$ than a mono-silicon silicide NiSi, increasing a process window for forming a landing pad. $NiSi_2$ has a thin film resistivity of 40-50 μΩcm, which is lower than a thin film resistivity of N+ polysilicon as used in a conventional method for forming a landing pad.

FIGS. 3 through 9 illustrate an example process flow for a vertical thin-channel film structure that includes a landing pad disposed on a top surface of a stack of conductive strips, the landing pad having a silicide consisting essentially of di-silicon silicide.

Figure 3:
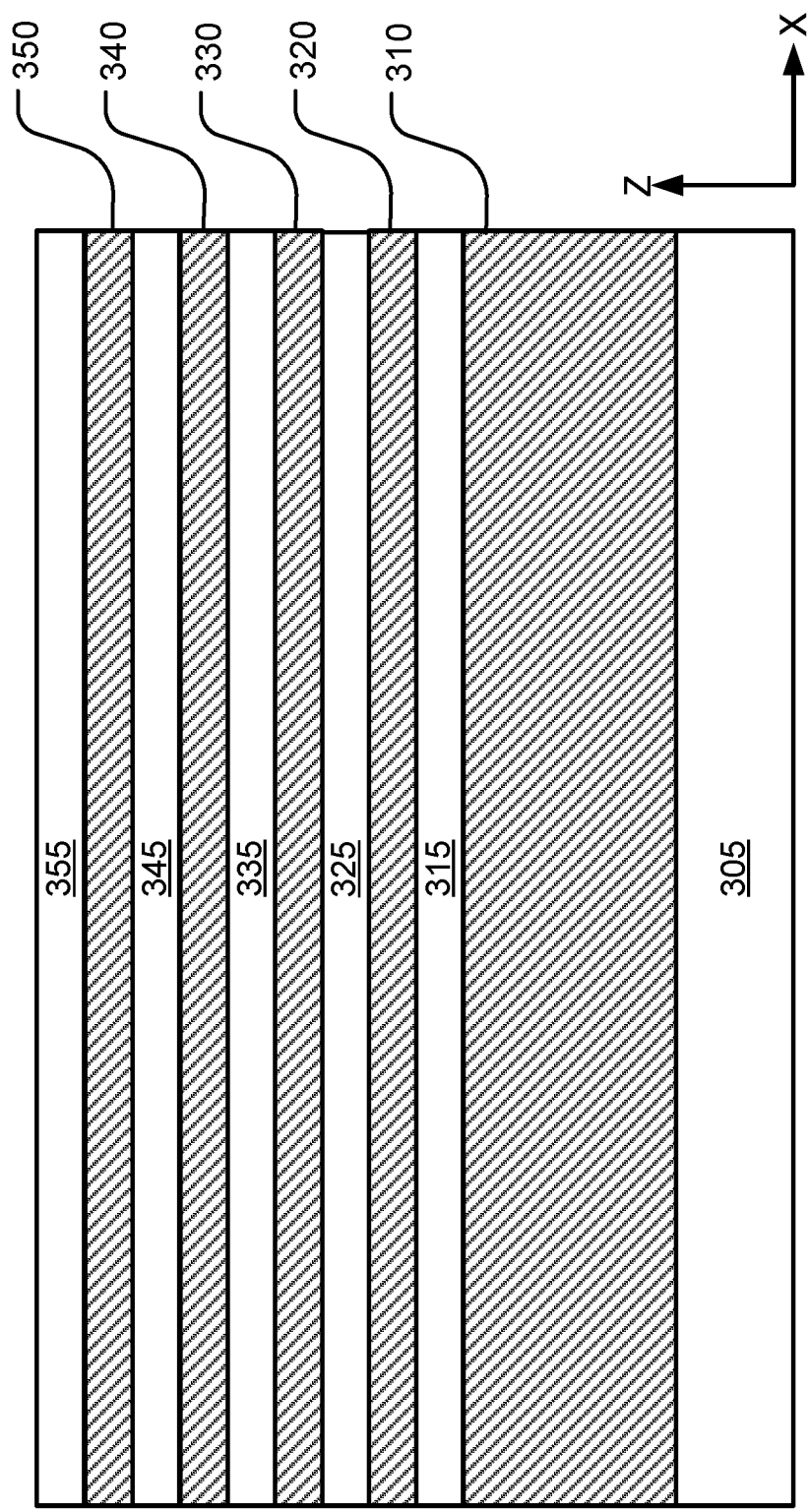
FIGS. 3 through 9 illustrate an example process flow for a vertical thin-channel film structure that includes a landing pad disposed on a top surface of a stack of conductive strips, the landing pad having a silicide consisting essentially of di-silicon silicide.

FIG. 3 illustrates a stage of the process flow after forming an insulating layer 305 which can comprise a silicon oxide or other dielectric on a semiconductor substrate. To form the structure shown in FIG. 3, a plurality of layers of a conductive material (e.g. 310, 320, 330, 340, 350), suitable to act as ground select lines, word lines and string select lines, separated by layers of insulating material (e.g. 315, 325, 335, 345, 355), are disposed over the insulating layer 305. In embodiments described herein, the conductive material can be a heavily p-type doped polysilicon (P+ polysilicon) or other material selected for compatibility with the data storage structure. The layers of insulating material can comprise silicon dioxide deposited in a variety of ways as known in the art.

Figure 4:
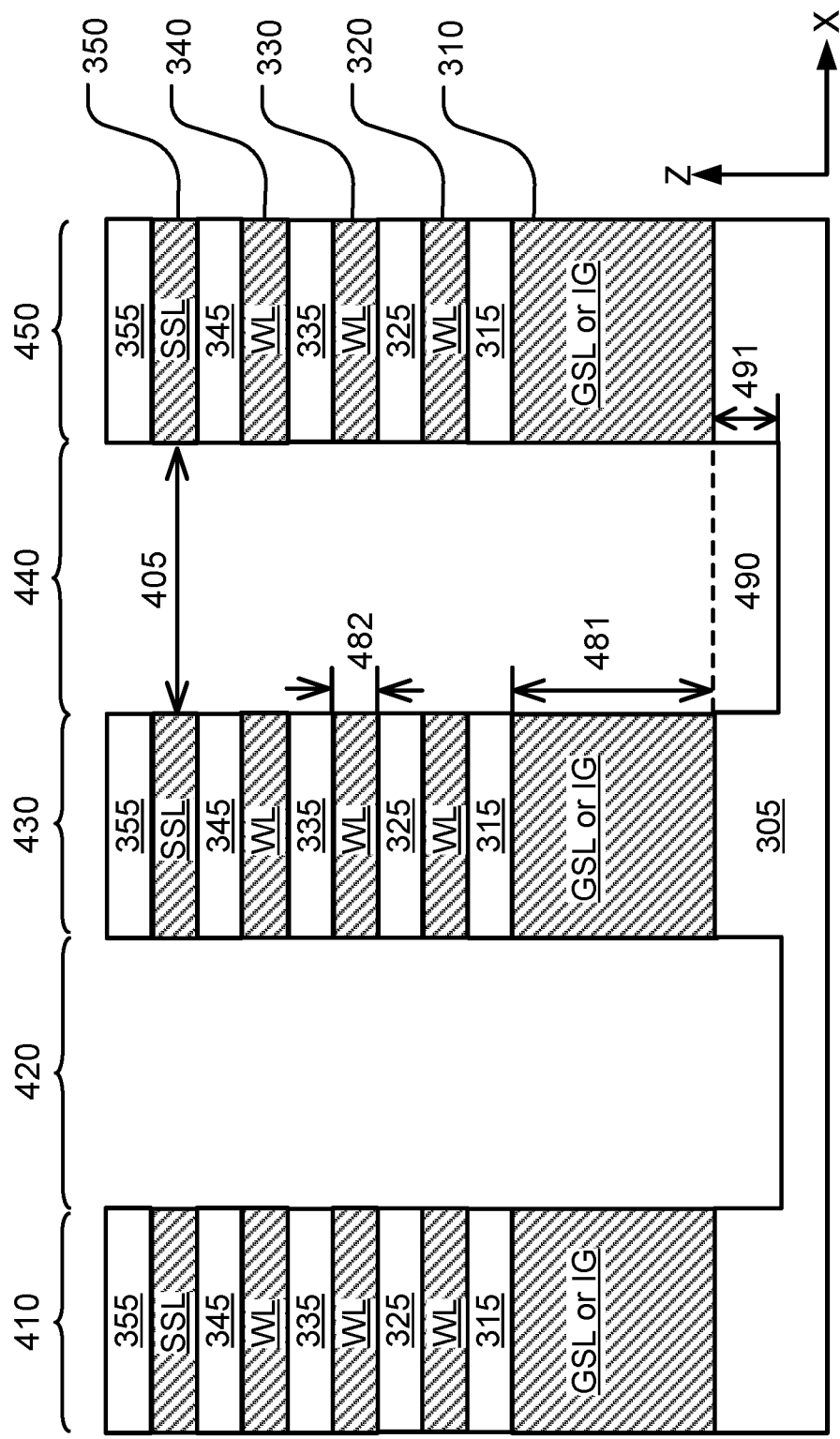

FIG. 4 illustrates a stage of the process flow after etching the plurality of layers of a conductive material, and stopping at the insulating layer 305, to define a plurality of stacks of conductive strips (e.g. 410, 430 and 450) separated by trenches (e.g. 420, 440). The conductive strips in the stacks have sidewalls. In one embodiment, the trenches can have a width 405 between 50 nm to 200 nm (nm=nanometer), typically between 70 nm to 120 nm.

The stacks can include at least a bottom plane of conductive strips acting as ground select lines (GSLs) or inversion gates (IGs), a plurality of intermediate planes (WLs) of conductive strips, and a top plane of conductive strips acting as string select lines (SSLs). The plurality of intermediate planes can include N planes, ranging from 0 to N−1 for the stacks. The inversion gates can generate an inversion layer to reduce cell current when the inversion gates have a bias greater than the threshold voltage of the memory cells in the memory array. The conductive strips in the bottom plane (GSLs or IGs) have a thickness 481 greater than a thickness 482 of the conductive strips in the plurality of intermediate planes (WLs). The greater thickness of the conductive strips in the bottom plane can provide better control during the process for etching the plurality of layers of a conductive material and stopping at the insulating layer 305, so as to reduce a depth 491 of a recess 490 on the insulating layer 305.

Figure 5:
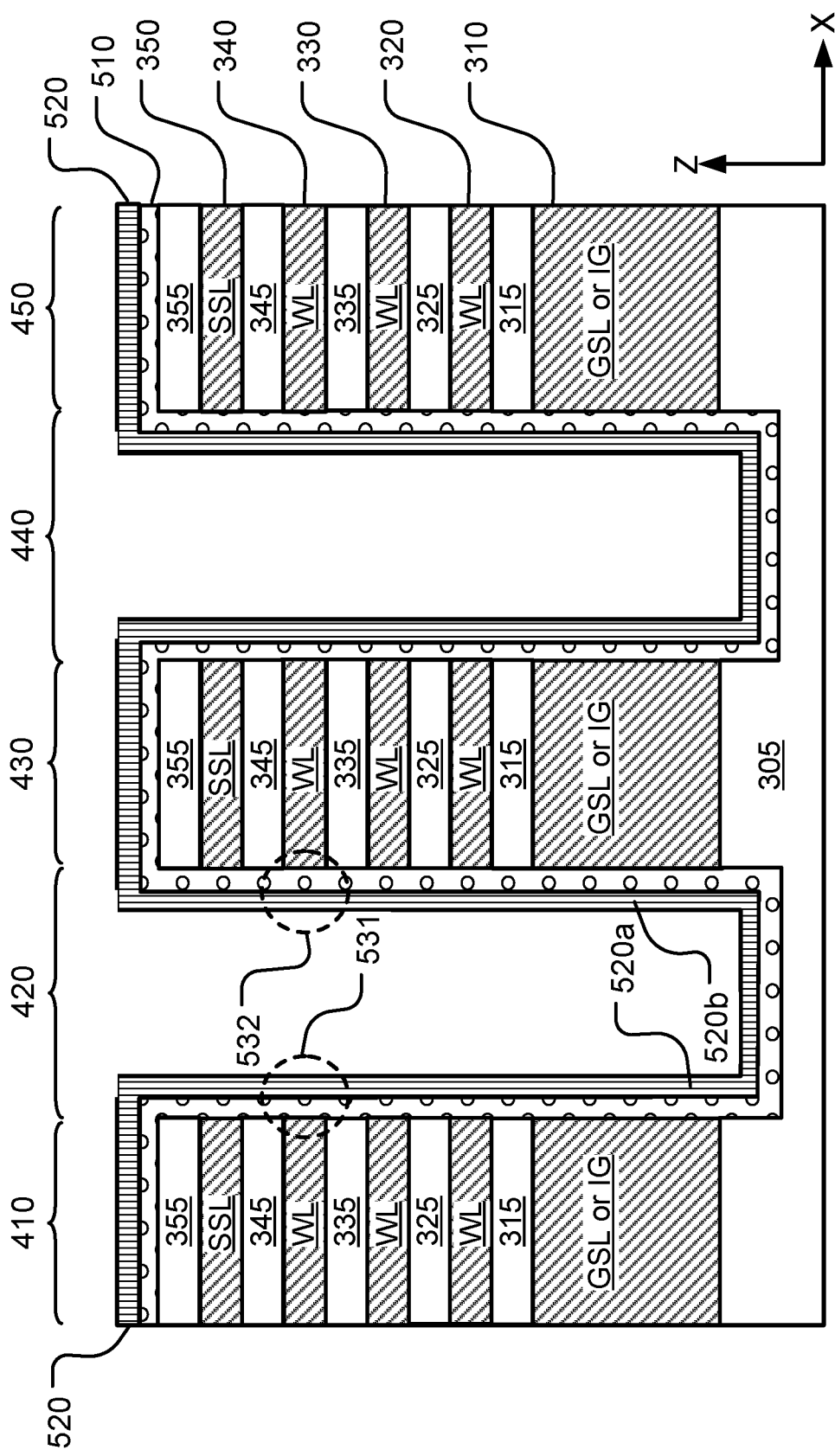

FIG. 5 illustrates a stage of the process flow after forming a memory layer 510 over top surfaces of the stacks (e.g. 410, 430, 450), on the sidewalls of the conductive strips in the stacks, and over the bottom of the trenches (e.g. 420, 440) between the stacks. The memory layer can comprise a multilayer data storage structure, including a tunneling layer, a charge storage layer, and a blocking layer. The memory layer 510 can include dielectric charge trapping devices (e.g. SONOS, BE-SONOS, TANOS, MA BE-SONOS). The memory layer contacts sidewalls of the conductive strips in the stack of conductive strips.

A layer of silicon material 520 is then formed on the memory layer over the top surfaces of the stacks and the sidewalls of the conductive strips in the stacks, and over the bottom of the trenches between the stacks. The layer of silicon material 520 has outside surfaces in contact with the memory layer 510 and inside surfaces opposite the outside surfaces. In one embodiment, the layer of silicon material 520 can have a thickness of about 5 nm to 30 nm, typically 10 nm-20 nm.

The layer of silicon material 520 can include a vertical thin channel film (e.g. 520*a*, 520*b*) disposed vertically in contact with the memory layer 510 on the sidewalls of the conductive strips in the stacks (e.g. 410, 430, 450). The memory cells in the plurality of memory cells (e.g. 531, 532) have channels in the vertical thin channel film (e.g. 520*a*, 520*b*) and gates in the conductive strips (e.g. WLs) in the stacks.

The layer of silicon material can be formed in two sub-steps. A first sub-step can include depositing a first layer of silicon material conformally with uniform thickness to a memory layer on the top surface of the stack of conductive strips and sidewalls of the conductive strips in the stack. A second sub-step can include depositing a second layer of silicon material non-formally over the first layer of silicon material. The second layer of silicon material can have greater thickness in the landing pad region on the top surface of the stack of conductive strips than in the channel region on sidewalls of the conductive strips in the stack. The second sub-step can use a non-conformal plasma enhanced chemical vapor deposition.

Figure 6:
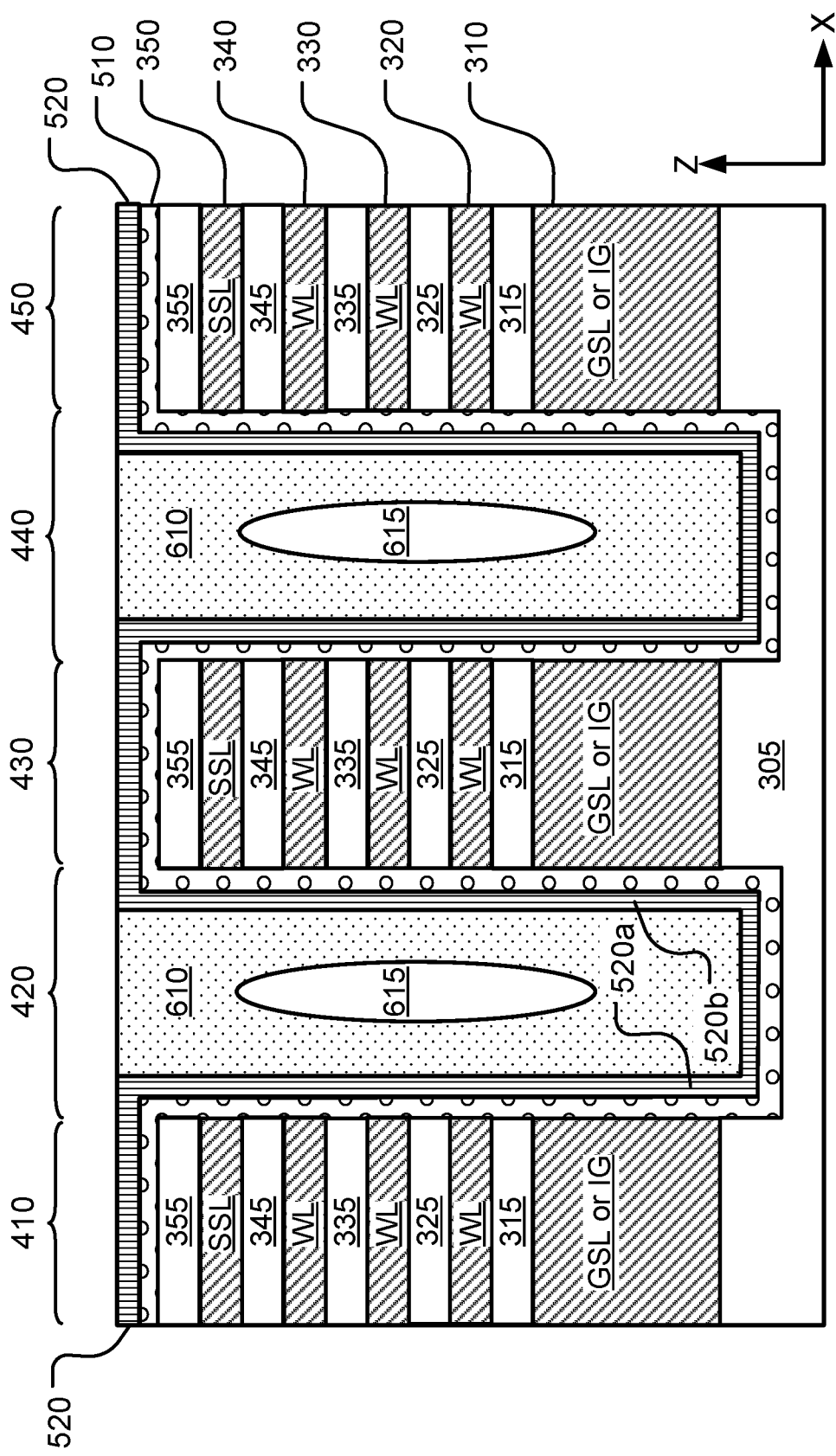

FIG. 6 illustrates a stage in the process flow after filling between stacks on the inside surfaces of the layer of silicon material 520 with an insulating material 610 such as silicon dioxide, leaving an air gap 615, when possible, at least in regions adjacent the intermediate layers of conductive strips that can act as word lines (WLs). The filling step includes depositing the insulating material on the top surface of the layer of silicon material 520, with a thickness of about 30 nm to 50 nm. After the fill step, an etch back or planarizing step such as chemical mechanical planarization can be applied to expose the top surface of the layer of silicon material 520. In the illustrated example, the insulating material 610 of the fill includes gaps 615 in the regions of the memory cells. In an embodiment including an air gap 615 in the insulating material 610 of the fill, the air gap is formed below a level of the top surface of the layer of silicon material, so an etch back does not expose the air gap.

Figure 7:
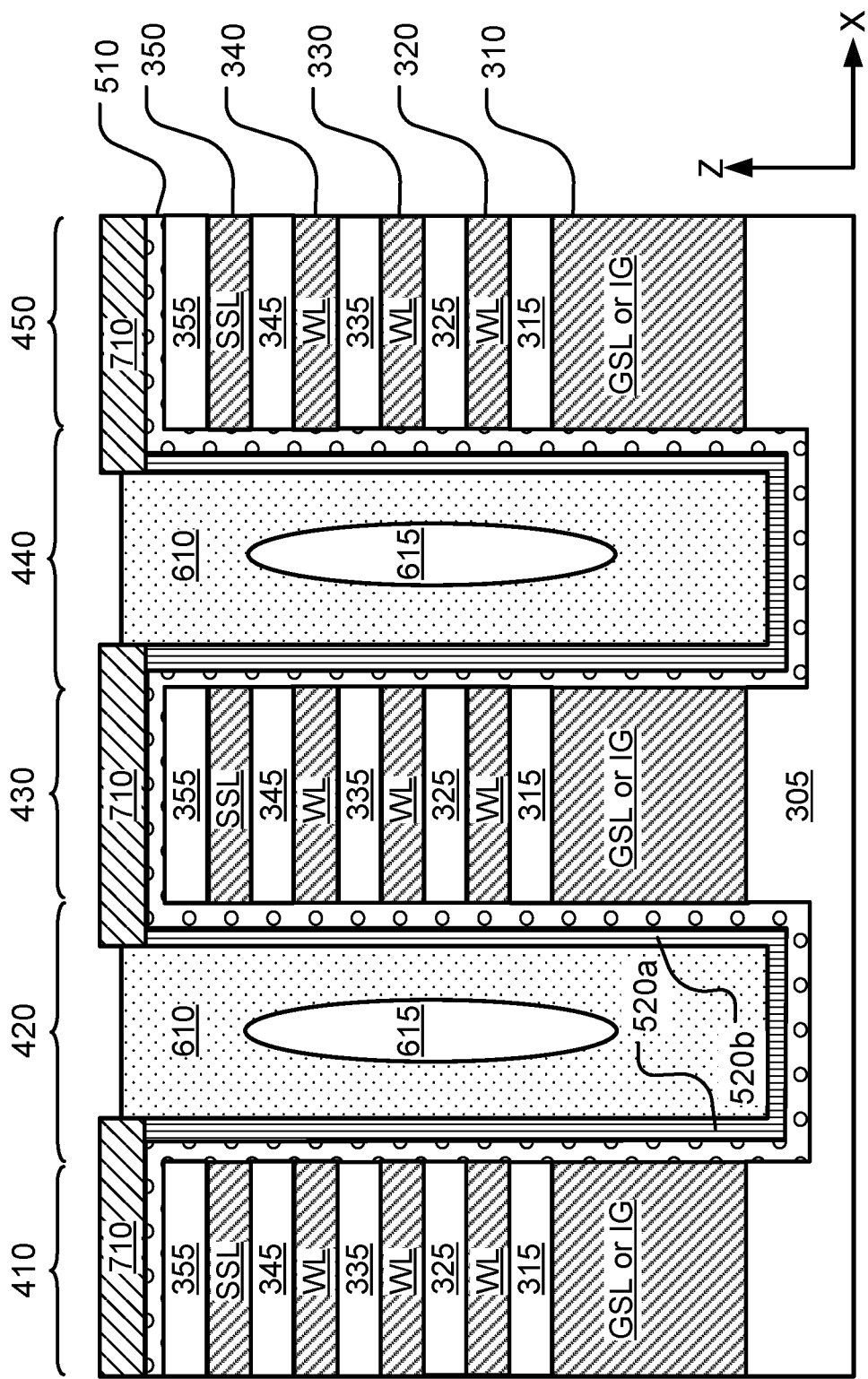

FIG. 7 illustrates a stage in the process flow after forming an initial silicide layer 710, including depositing and annealing a precursor metal (e.g. Cobalt) over a layer of silicon material (e.g. 520, FIG. 6) on a top surface of a stack of conductive strips (e.g. 410, 430, 450) in amounts effective to result in a majority of the initial silicide layer being a mono-silicon silicide of the precursor metal. Forming the initial silicide layer includes annealing at a first temperature range (e.g. 400° C. to 600° C.), using a process known as Rapid Thermal Processing in the art. After forming the initial silicide layer, remnants of the precursor metal is removed, using a selective etch process with a cleaning solution such as SC1, SC2 or SPM as known in the art that does not consume mono-silicon silicide of the initial silicide layer. Here SC1 refers to a Standard Clean-1 procedure using for example a cleaning solution $H_2O_2$—$NH_4OH$—$H_2O$, SC2 refers to a Standard Clean-2 procedure using for example a cleaning solution $H_2O_2$—NCl—$H_2O$, and SPM refers to a mixture of sulfuric acid ($H_2SO_4$) and hydrogen peroxide ($H_2O_2$).

At this stage, there may be remnants of the layer of silicon material 520 on the top surface of a stack of conductive strips (e.g. 410, 430, 450) after the initial silicide layer 710 is formed. At a later stage as described in referenced to FIG. 9, the remnants of the layer of silicon material 520, if any, will be consumed by the process to form di-silicon silicide of the precursor metal in a landing pad (e.g. 911, 912, 913, FIG. 9).

In one embodiment, the precursor metal can include Cobalt (Co), the layer of silicon material (e.g. 520, FIG. 6) can include polycrystalline silicon, and the initial silicide layer 710 can include CoSi.

For example, the deposition of Colbalt can have a thickness of 7.5 nm, depending on the thickness of the layer of silicon material (e.g. 520, FIG. 6) on a top surface of a stack of conductive strips (e.g. 410, 430, 450). In this example, 7.5 nm of Colbalt can consume 1.8 times of the silicon material in the layer of silicon material (i.e. 7.5 nm×1.8=13.5 nm of silicon), to result in 2 times of CoSi (i.e. 7.5 nm×2=15 nm of CoSi).

In an alternative embodiment, the precursor metal can include Nickel (Ni), the layer of silicon material (e.g. 520, FIG. 6) can include polycrystalline silicon, and the initial silicide layer 710 can include NiSi.

Figure 8:
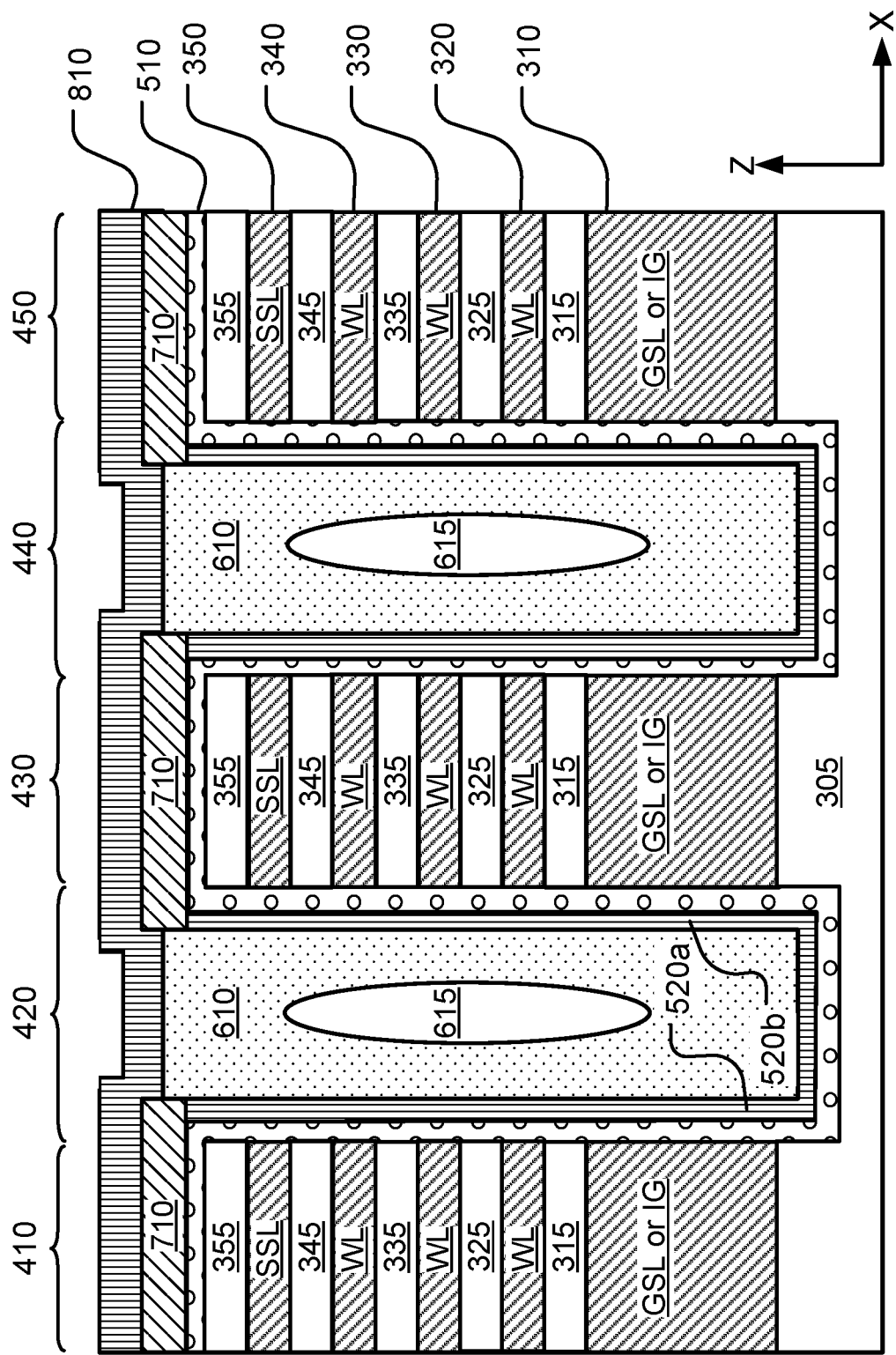

FIG. 8 illustrates a stage in the process flow after depositing additional silicon material 810 over the initial silicide layer 710 in amounts effective to result in formation of di-silicon silicide of the precursor metal to form a landing pad (e.g. 911, 912, 913, FIG. 9) on the top surface of the stack of conductive strips (e.g. 410, 430, 450). The additional silicon material 810 can include N+ polysilicon and have a thickness of about 30 nm to 40 nm.

Figure 9:
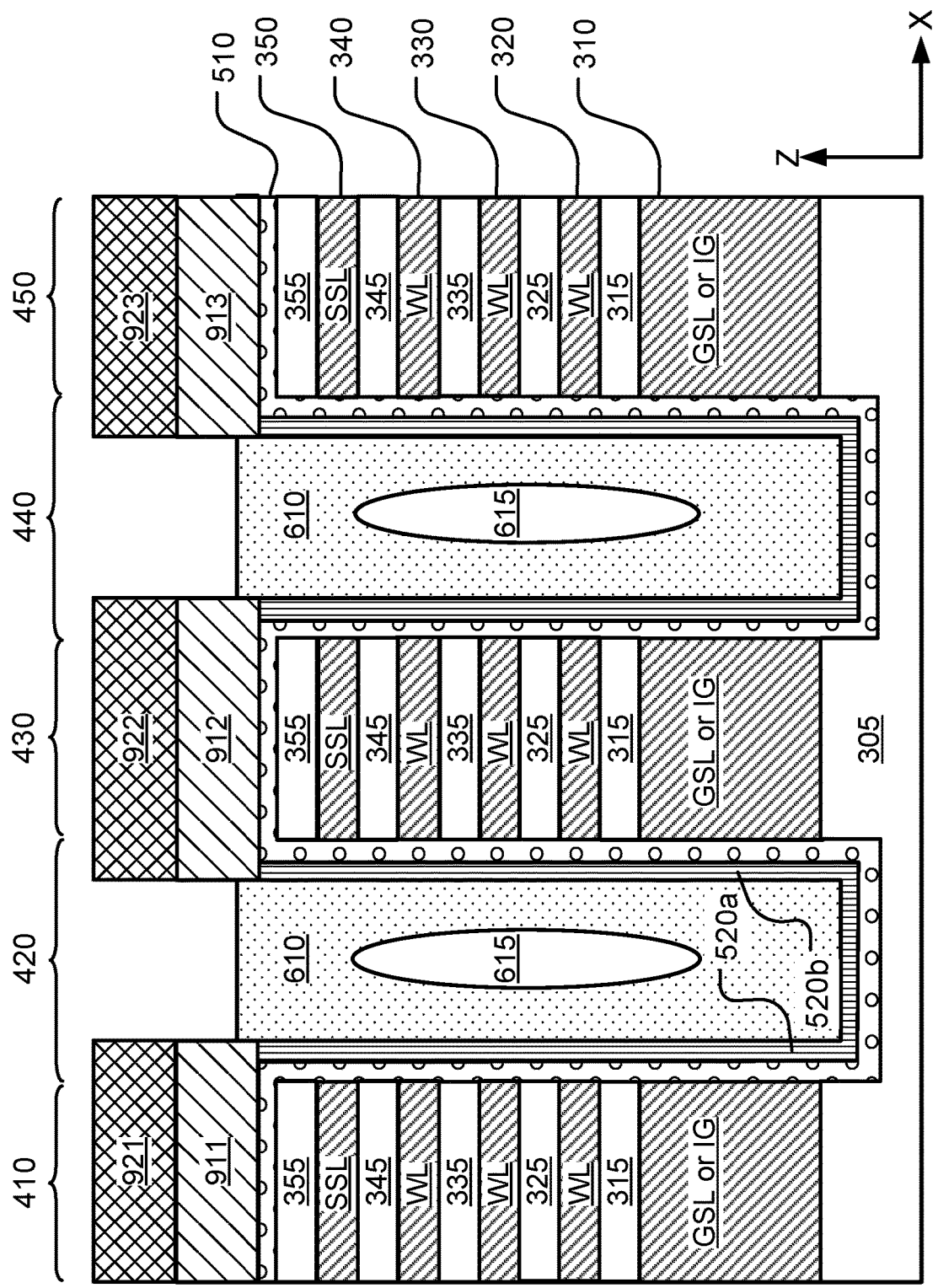

FIG. 9 illustrates a stage in the process flow after annealing the additional silicon material (e.g. 810, FIG. 8) deposited over the initial silicide layer (e.g. 710, FIG. 8) to result in formation of di-silicon silicide of the precursor metal to form a landing pad (e.g. 911, 912, 913) on the top surface of the stack of conductive strips (e.g. 410, 430, 450). The formation of the di-silicon silicide of the precursor metal can consume mono-silicon silicide of the initial silicide layer (e.g. 710, FIG. 8), so a majority of a silicide of the landing pad is di-silicon silicide.

The di-silicon silicide of the precursor metal of the landing pad (e.g. 911, 912, 913) is electrically continuous with and physically in contact with the vertical thin channel film (e.g. 520a, 520b) on the sidewalls of the conductive strips in the stack (e.g. 410, 430).

The annealing of the additional silicon material can be performed at a second temperature range (e.g. 600° C. to 800° C.) higher than the first temperature range (e.g. 400° C. to 600° C.) for forming the initial silicide layer as described in reference to FIG. 7. After the formation of the di-silicon silicide of the precursor metal, remnants of the additional silicon material 810 is removed, using a process (e.g. SC1) that does not consume the di-silicon silicide of the precursor metal and the insulating material 610. Here SC1 refers to a Standard Clean-1 procedure using for example a cleaning solution $H_2O_2$—$NH_4OH$—$H_2O$. A dry etch recipe can also be used to remove remnants of the additional silicon material 810. The dry etch recipe selectively etches the remnants of the additional silicon material 810 with respect to the di-silicon silicide of the precursor metal of the landing pad (e.g. 911, 912, 913) and the insulating material 610. The process is self-aligned because it reacts on the initial silicide layer 710 without using lithographic steps.

In one embodiment, the additional silicon material can include polycrystalline silicon, the initial silicide layer can include CoSi, and the di-silicon silicide of the precursor metal can include $CoSi_2$. In an alternative embodiment, the additional silicon material can include polycrystalline silicon, the initial silicide layer can include NiSi, and the di-silicon silicide of the precursor metal can include $NiSi_2$.

Formation of the initial silicide layer (e.g. 710, FIG. 7), a majority of which being a mono-silicon silicide of the precursor metal (e.g. CoSi), consumes less silicon in the layer of silicon material (e.g. 520, FIG. 6) than the formation of the di-silicon silicide of the precursor metal (e.g. CoSi2) to form a landing pad (e.g. 911, 912, 913, FIG. 9). The additional silicon material deposited over the initial silicide layer prevents the excess consumption of silicon in the layer of silicon material that could cause the landing pad to be electrically discontinuous with the vertical thin channel film on the sidewalls of the conductive strips in the stack.

In one example where the precursor metal includes Cobalt (Co), in the formation of the initial silicide layer (e.g. CoSi), 1.82 nm of silicon can be consumed per 1 nm of the precursor metal, while in the formation of the di-silicon silicide of the precursor metal (e.g. CoSi2), 3.64 nm of silicon can be consumed per 1 nm of the precursor metal. For instance, with effective amounts of N+ polysilicon in the additional silicon material, 15 nm of CoSi can result in about 27 nm of $CoSi2_2$, without causing the landing pad to be electrically discontinuous with the vertical thin channel film on the sidewalls of the conductive strips in the stack.

A first bit line 921 can be formed over the first landing pad 911, the bit line contacting the di-silicon silicide of the precursor metal of the first landing pad 911, and a second bit line 923 can be formed over the third landing pad 913, the second bit line 923 contacting the di-silicon silicide of the precursor metal of the third landing pad 913, after the remnants of the additional silicon material is removed. The first landing pad 911 and the third landing pad 913 can be referred to as di-silicon silicide bit line landing pads.

A second landing pad 912 can be disposed on a top surface of a second stack of conductive strips (e.g. 430) adjacent the first-mentioned stack of conductive strips (e.g. 410), a majority of a silicide of the landing pad being di-silicon silicide. A source line 922 can be formed over the second landing pad 912, the source line contacting the di-silicon silicide of the precursor metal of the second landing pad 912. The second landing pad 912 can be referred to as a di-silicon silicide source line landing pad.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A method for manufacturing a memory device, comprising:
   forming an initial silicide layer, including depositing and annealing a precursor metal over a layer of silicon material on a top surface of a stack of conductive strips in amounts effective to result in a majority of the initial silicide layer being a mono-silicon silicide of the precursor metal; and
   depositing and annealing additional silicon material over the initial silicide layer in amounts effective to result in formation of di-silicon silicide of the precursor metal to form a landing pad on the top surface of the stack of conductive strips, the formation of the di-silicon silicide of the precursor metal consuming mono-silicon silicide of the initial silicide layer so a majority of a silicide of the landing pad is di-silicon silicide.

2. The method of claim 1, wherein forming the initial silicide layer includes annealing at a first temperature range, and the annealing of the additional silicon material is performed at a second temperature range higher than the first temperature range.

3. The method of claim 1, comprising:
   forming data storage structures on sidewalls of the conductive strips in the stack;
   forming the layer of silicon material on the top surface of the stack of conductive strips and sidewalls of the conductive strips in the stack of conductive strips, the conductive strips in the stack including word lines coupled to memory cells on the sidewalls of the conductive strips in the stack, the layer of silicon material including a vertical thin channel film in the memory cells disposed vertically in contact with the data storage structures on the sidewalls of the conductive strips in the stack,
   wherein the di-silicon silicide of the precursor metal of the landing pad is electrically continuous with and physically in contact with the vertical thin channel film on the sidewalls of the conductive strips in the stack,
   wherein the memory cells have channels in the vertical thin channel film and gates in the conductive strips in the stack.

4. The method of claim 3, said forming the layer of silicon material comprising:
   depositing a first layer of silicon material conformally to a memory layer on the top surface of the stack of conductive strips and sidewalls of the conductive strips in the stack; and
   depositing a second layer of silicon material non-conformally over the first layer of silicon material.

5. The method of claim 1, comprising:
Removing remnants of the precursor metal, after said forming the initial silicide layer.

6. The method of claim 1, comprising:
removing remnants of the additional silicon material, after the formation of the di-silicon silicide of the precursor metal.

7. The method of claim 1, comprising:
forming a bit line over the landing pad, the bit line contacting the di-silicon silicide of the precursor metal of the landing pad.

8. The method of claim 1, the memory device comprising a second landing pad disposed on a top surface of a second stack of conductive strips adjacent the first-mentioned stack of conductive strips, a majority of a silicide of the second landing pad being di-silicon silicide, the method comprising:
forming a source line over the second landing pad, the source line contacting the di-silicon silicide of the precursor metal of the second landing pad.

9. The method of claim 1, wherein the precursor metal includes Cobalt.

10. The method of claim 1, wherein the precursor metal includes Nickel.

11. A memory device including a plurality of memory cells, comprising:
a stack of conductive strips having sidewalls;
data storage structures on the sidewalls of the conductive strips in the stack;
a vertical thin channel film disposed vertically in contact with the data storage structures on the sidewalls of the conductive strips in the stack;
the memory cells in the plurality of memory cells having channels in the vertical thin channel film and gates in the conductive strips in the stack;
a landing pad including silicide disposed on a top surface of the stack of conductive strips,
wherein the landing pad including the silicide is electrically continuous with and physically in contact with the vertical thin channel film on the sidewalls of the conductive strips in the stack.

12. The memory device of claim 11, the silicide consisting essentially of di-silicon silicide.

13. The memory device of claim 12, wherein the di-silicon silicide of the landing pad includes $CoSi_2$.

14. The memory device of claim 12, wherein the di-silicon silicide of the landing pad includes $NiSi_2$.

15. The memory device of claim 12, comprising:
a bit line over the landing pad, the bit line contacting the di-silicon silicide of the landing pad.

16. The memory device of claim 12, comprising:
a second landing pad disposed on a top surface of a second stack of conductive strips adjacent the first-mentioned stack of conductive strips, the second landing pad including the silicide consisting essentially of di-silicon silicide; and
a source line over the second landing pad, the source line contacting the di-silicon silicide of the second landing pad.

17. The memory device of claim 11, wherein a majority of the silicide of the landing pad is di-silicon silicide.

* * * * *